(12) United States Patent
Zhang

(10) Patent No.: US 10,450,469 B2
(45) Date of Patent: Oct. 22, 2019

(54) TRANSPARENT SELF-HEALING OLEOPHOBIC AND HYDROPHOBIC COATINGS

(71) Applicant: NBD NANOTECHNOLOGIES, INC., Danvers, MA (US)

(72) Inventor: Bong June Zhang, Chestnut Hill, MA (US)

(73) Assignee: NBD NANOTECHNOLOGIES, INC., Lexington, MA (US)

(*) Notice: Subject to any disclaimer, the term of this patent is extended or adjusted under 35 U.S.C. 154(b) by 465 days.

(21) Appl. No.: 15/177,484

(22) Filed: Jun. 9, 2016

(65) Prior Publication Data

US 2016/0362562 A1    Dec. 15, 2016

Related U.S. Application Data

(60) Provisional application No. 62/172,955, filed on Jun. 9, 2015.

(51) Int. Cl.
| | | |
|---|---|---|
| *C09D 5/16* | (2006.01) | |
| *C23C 2/00* | (2006.01) | |
| *C23C 4/00* | (2016.01) | |
| *C23C 16/455* | (2006.01) | |
| *B05D 1/18* | (2006.01) | |
| *C23C 28/00* | (2006.01) | |

(Continued)

(52) U.S. Cl.
CPC ............ *C09D 5/1625* (2013.01); *B05D 1/18* (2013.01); *B05D 3/142* (2013.01); *B05D 5/083* (2013.01); *C23C 2/00* (2013.01); *C23C 4/00* (2013.01); *C23C 16/455* (2013.01); *C23C 28/00* (2013.01); *B05D 2203/35* (2013.01)

(58) Field of Classification Search
CPC ...... C09D 5/1625; B05D 3/142; B05D 5/083; B05D 2203/35
See application file for complete search history.

(56) References Cited

U.S. PATENT DOCUMENTS

2003/0183245 A1*  10/2003  Sheu ................. B05D 1/60
                                                    134/1.2
2012/0009429 A1*  1/2012  Shmueli ............. C03C 17/3411
                                                    428/447

(Continued)

FOREIGN PATENT DOCUMENTS

WO    2009029979 A1    3/2009
WO    2015054652 A2    4/2015

OTHER PUBLICATIONS

Wang et al, Robust, Superamphiphobic Fabric with Multiple Self-Healing Ability against Both Physical and Chemical Damages, Sep. 27, 2013, ACS Publications, Applied Materials & Interfaces, 5, pp. 10221-10226 (Year: 2013).*
El Aziz et al, Facile Synthesis of Novel Functionalized Silsesquioxane Nanostructures Containing an Encapsulated Fluoride Anion, Aug. 13, 2012, ACS Publications, Organometallics, 31, pp. 6032-6040 (Year: 2012).*

(Continued)

*Primary Examiner* — Scott R. Walshon
*Assistant Examiner* — Jasper Saberi
(74) *Attorney, Agent, or Firm* — Barnes & Thornburg LLP; Jason Bernstein

(57) ABSTRACT

The present disclosure relates, in exemplary embodiments, to processes for preparing omniphobic coatings on a substrate. The disclosure further relates to substrates comprising an omniphobic coating comprising a fluoride ion encapsulated F-POSS.

9 Claims, 5 Drawing Sheets

(51) Int. Cl.
*B05D 3/14* (2006.01)
*B05D 5/08* (2006.01)

(56) References Cited

U.S. PATENT DOCUMENTS

| | | | | |
|---|---|---|---|---|
| 2013/0337226 | A1* | 12/2013 | Curran | C09D 5/00 428/141 |
| 2014/0011013 | A1* | 1/2014 | Jin | B05D 5/08 428/297.4 |
| 2014/0023852 | A1* | 1/2014 | Bower | B05D 5/083 428/321.1 |
| 2014/0147631 | A1* | 5/2014 | Yang | B05D 5/08 428/143 |
| 2016/0251803 | A1* | 9/2016 | Tuteja | D21H 17/11 428/311.71 |

OTHER PUBLICATIONS

Tuteja et al, "Robust omniphobic surfaces", PNAS, vol. 105, No. 47, pp. 18200-18205 (Year: 2008).*

International Preliminary Report on Patentability for International Patent Application No. PCT/US2016/036567; dated Dec. 12, 2017.

Teshima et al.; Transparent ultra water-repellent poly(ethylene terephthalate) substrates fabricated by oxygen plasma treatment and subsequent hydrophobic coating; Applied Surface Science; 2005; pp. 619-622; vol. 244.

Tuteja et al., Robust omniphobic surfaces, Proceedings of the National Academy of Science, 2008, vol. 105, No. 47, pp. 18200-18205.

Search Report and Written Opinion from International Application No. PCT/US2016/036567, dated Nov. 3, 2016.

* cited by examiner

TRANSPARENT SELF-HEALING OLEOPHOBIC AND HYDROPHOBIC COATINGS

CROSS REFERENCE TO RELATED APPLICATION

This patent application claims priority to U.S. Provisional Patent Application No. 62/172,955, filed Jun. 9, 2015, the disclosure of which is incorporated herein by reference in its entirety.

FIELD

The present disclosure relates, in exemplary embodiments, to processes for preparing oleophobic and hydrophobic coatings on a substrate.

BACKGROUND

The presence of liquids, often laden with dirt, is critical in safety particularly, for a transparent substrate of the glazing type, especially one used in the transportation. The nonwetting property of a substrate can be categorized as omniphobic. The benefit of incorporating an omniphobic coating on a substrate, especially a glass substrate, for this type of product is three folds. Firstly, it allows the water droplets to slide off vertical or inclined surfaces, especially under the effect of aerodynamic forces or mechanical motions, for example in the case of a moving vehicle. Secondly, these droplets, sliding off the substrate, cleanse the surface by incorporating dirt and carry this away. Especially, the visibility of glass substrates can be improved to a certain degree by dispensing windshield washer fluids or cleaning devices windshield wipers. Thirdly, most of coatings degrade over a period of time. The omniphobic coating that is self-healing due to thermodynamic stimulus (heat) is desired. In such a case, thermally treated omniphobic coatings recovering its liquid repellency up to 20% is desired.

One of the problems arising with the greatest acuity in the field of omniphobic coatings is that of the mechanical abrasion of the omniphobic coating. This abrasion occurs to a greater or lesser extent during substrate cleaning operations, which are periodically necessary, in particular for restoring satisfactory vision through a transparent substrate. Thus, it has long been sought to minimize the gradual removal of the omniphobic coatings of the aforementioned types, this occurring in particular under the action of windshield wipers in the case of an automobile, airplane, boat/ship windshield. Such removal may moreover and additionally result from degradation by ultraviolet radiation.

Because of the problems outlined above, there is a need for improved omniphobic coatings. It has been discovered that certain fluoroalkylsilanes (FAS), alkylsilanes (AS), and fluoride ion encapsulated fluoro oligomeric silsesquioxanes (F⁻-F-POSS) can be applied to substrates as omniphobic coatings with improved properties. Also described are processes for preparing omniphobic coatings.

SUMMARY

The present disclosure provides exemplary embodiments of a process for obtaining an omniphobic coating on a substrate comprising the steps of
 a. activating a substrate by contacting the substrate with a plasma of a gas; and
 b. depositing at least one layer of an oleophobic coating comprising at least one fluorocompound.

In exemplary embodiments, the at least one fluorocompound is a fluoride ion inserted fluoro polyhedral oligomeric silsesquioxane (F⁻-F-POSS) having the structural formula [1] shown below:

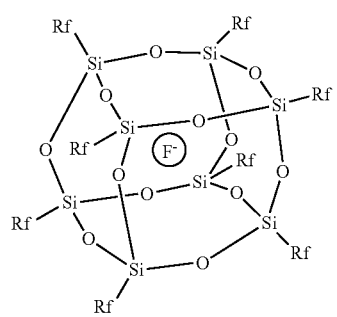

wherein Rf is $F_3C-(CF_2)_m-(CH_2)_n-$, wherein m is an integer from 0 to 15 and n is an integer from 0 to 5; or an FAS agents of the formula

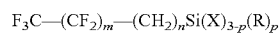

wherein m is an integer from 0 to 15; n is an integer from 0 to 5; p is 0, 1 or 2; R is an alkyl group or a hydrogen atom; and X is a hydrolysable group; or AS agents of the formula

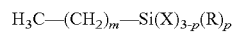

wherein m is an integer from 0 to 15; p is 0, 1 or 2; R is an alkyl group or a hydrogen atom; and X is a hydrolysable group, and aqueous acid or base.

In some embodiments, the step of depositing is carried out with a mixture of at least one fluorocompound and aqueous acid or base.

BRIEF DESCRIPTION OF THE DRAWINGS

The drawings disclose exemplary embodiments in which like reference characters designate the same or similar parts throughout the figures of which:

FIG. 4A shows the water contact angle was greater than 90 after 2000 cycles of the mechanical abrasion test at 250 g weight load; FIG. 4B shows the water contact angle behavior and recovery over 6000 cycles of the mechanical abrasion test at 500 g weight load with a recovery of water contact angle to 90° after a 2 hour thermal annealing at 75° C.

FIG. 5 is a graph of abrasion resistance tests conducted on a glass substrate coated with omniphobic coatings as described herein showing water contact angle measurements of various coatings; (■) F⁻-F-POSS/FAS without aqueous base (Sample X); (●) FAS (Sample Y); (▲) F⁻-F-POSS/AS.

DETAILED DESCRIPTION

Figure 1:
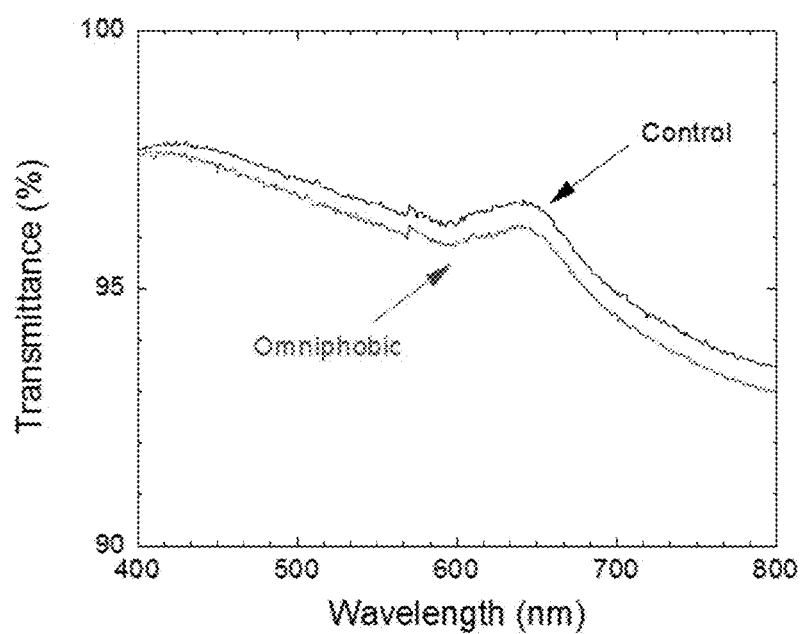
FIG. 1 is a graph of the transmittance measurement of an uncoated glass substrate versus a glass substrate coated with an omniphobic coating as described herein showing no significant transmittance loss after coating.

The present disclosure relates, in exemplary embodiments, to the omniphobic surface treatment of a substrate, especially, a glass material, a ceramic, a glass-ceramic, with at least one fluorocompound. Substrates for use in connection with the disclosure can be, for example, glass parts for rear view camera lens, windshields, and side windows in, for example, the aeronautical, railway or automotive fields. In some embodiments, substrates for use in connection with the present disclosure will contain free hydroxyl groups on their surface. In some embodiments, substrates for use in connection with the present disclosure can be a glass or oxide surface having free hydroxyl groups on the surface. It will be appreciated that the omniphobic surface treatments described herein can also be used in other fields, such as the building field or in the interior design field, for example as decorative panels, for furniture, for domestic electrical equipment (such as refrigerator doors, oven doors, and display cases), and the like.

One objective of the omniphobic surface treatments described herein, among others, is to provide the substrate with an optically transparent, nonwetting, mechanically durable, and self-healing characters. As used herein, the term "wettability" means the property whereby polar or non-polar liquids adhere to a substrate, forming an undesirable film, and also the tendency of a substrate to retain dust or dirt of all kinds, fingerprints, insects, and the like.

As used here, the term "omniphobic substrate" means an oil (including organic liquids) and water repellent substrate. As is conventionally known in the art, the contact angle of an omniphobic surface on a flat surface is typically at least greater than 70° for hexadecane and typically at least greater than 90° in the case of water. On an omniphobic surface, a liquid tends to bead up and easily flow off a substrate, by, for example, gravity if the substrate is on an incline; or under the effect of aerodynamic forces or mechanical motion (vibration and rocking) if the surface is in motion as, for example, during the operation of a vehicle.

Agents useful for imparting omniphobic properties onto a surface and that can be used to form of a coating layer on a substrate, include but are not limited to, fluoroalkylsilanes (FAS), alkylsilanes (AS), or fluoride ion encapsulated fluoro polyhedral oligomeric silsesquioxane (F⁻-F-POSS) such as those described in US patent publication number US2008/0221262, incorporated herein by reference, in acidic or alkaline solution. Examples of FAS agents include, for example, alkyl silanes, the alkyl group of which has at least one perfluorinated end group, such as an $F_3C\text{---}(CF_2)_n\text{---}$ group, wherein n is zero or a positive integer. Examples of FAS agents useful in connection with the present teachings include FAS agents of the formula $$F_3C\text{---}(CF_2)_m\text{---}(CH_2)_n\text{---}Si(X)_{3-p}(R)_p$$

wherein m is an integer from 0 to 15; n is an integer from 0 to 5; p is 0, 1 or 2; R is an alkyl group or a hydrogen atom; and X is a hydrolysable group, such as a halide group or an alkoxy group. In some embodiments, m is an integer from about 3 to about 5. In some embodiments, n is an integer of about 2. In some embodiments, p is 0 or 1. In some embodiments, p is 0.

Examples of AS agents useful in connection with the present teachings include AS agents of the formula $$H_3C\text{---}(CH_2)_m\text{---}Si(X)_{3-p}(R)_p$$

wherein m is an integer from 0 to 15; p is 0, 1 or 2; R is an alkyl group or a hydrogen atom; and X is a hydrolysable group, such as a halide group or an alkoxy group. In some embodiments, m is an integer from about 3 to about 5. In some embodiments, p is 0 or 1. In some embodiments, p is 0.

Polyhedral silsesquioxanes have a cage-like structure, which is most commonly a cube, hexagonal prism, octagonal prism, decagonal prism, or dodecagonal prism. In exemplary embodiments, of the various possible F-POSS cage molecular structures, the cube-like ("T8") cage structure is formed. In exemplary embodiments, the present disclosure provides F-POSS compositions made of a blend of feedstock materials. In one exemplary embodiment, a first feedstock comprises a first fluorinated triethoxysilane and a second feedstock comprises a second fluorinated triethoxysilane. Each fluorinated triethoxysilane has a distinct carbon chain length C. In exemplary embodiments, C is in a range of 4-10. In exemplary embodiments, C is in a range of 4-10. In exemplary embodiments, C is 4, 6, 8 or 10. In exemplary embodiments, a first feedstock may be a C6 fluoroalkyl molecule and the second feedstock may be a C8 fluoroalkyl molecule. In exemplary embodiments, a first feedstock may be 1H, 1H, 2H, 2H nonafluorohexyltriethoxysilane. In exemplary embodiments, a second feedstock may be 1H, 1H, 2H, 2H perfluorooctyltriethoxysilane.

As examples, formulae for 6/2 F-POSS [3] and 4/2 F-POSS [4] molecules are shown below.

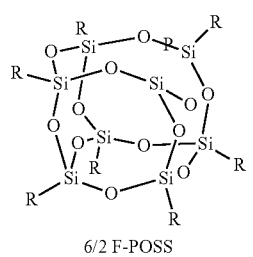

[3]

6/2 F-POSS
R = CH₂CH₂CF₂CF₂CF₂CF₂CF₂CF₃

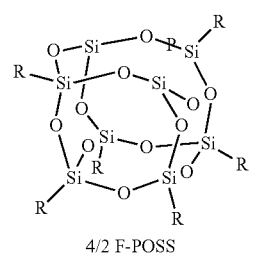

[4]

4/2 F-POSS
R = CH₂CH₂CF₂CF₂CF₂CF₃

F⁻-F-POSS molecules useful in connection with the present disclosure include molecules of the formula [5]:

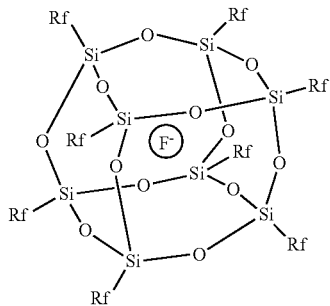

wherein Rf is $F_3C—(CF_2)_m—(CH_2)_n—$, wherein m is an integer from 0 to 15 and n is an integer from 0 to 5. In some embodiments, m is an integer from about 3 to about 5. In some embodiments, n is an integer of about 2.

Properties

In some embodiments, the main objects of the present disclosure are substrates coated with an omniphobic coating and its process, the properties of which are improved. More particularly, omniphobic substrates described herein provide not only with coatings having improved abrasion resistance performance but also self-healing never yet observed in relation to the performance of coatings known at the present time. Furthermore, according to another aspect of the present disclosure, omniphobic substrates described herein have a particularly high hydrolytic resistance.

Such performance typically provides the omniphobic substrates that more effectively meet the specifications imposed at the present time in, for example, the automotive or aeronautical industries, in terms of, for example, abrasion resistance, UV resistance, and salt corrosion resistance.

Another feature of exemplary embodiments of the presently disclosed synthetic blend material is that films and other structures formed therefrom have a degree of "nano-scale roughness" at the molecular level. This nano-scale roughness increases the hydrophobicity of the material, which may provide an increased water contact angle and hydrocarbon contact angle that enhances performance.

Products

Omniphobic glazed substrates obtained by the methods described herein are optically transparent, mechanically resistant, and self-healing. The present disclosure also relates to omniphobic glazing comprising or formed by a substrate as described herein. Such glazing being in useful as glazing in numerous fields, for example in vehicles or buildings.

The disclosure also relates to a glass, ceramic or glass-ceramic substrate provided with an omniphobic coating that can be obtained by implementing a process according to one of the embodiments described herein. The coating comprises an omniphobic layer of FAS or AS and F⁻-F-POSS in aqueous base or acid. In some embodiments, the surface of which has an RMS surface roughness of greater than 5 nm and has been activated by treatment with a plasma of a gas chosen from the noble gases, of the Ar or He type, and the gases $N_2$ or $O_2$, or by a plasma of a mixture of at least two of these gases, preferably under conditions not modifying or substantially not modifying the surface roughness. In some embodiments, the FAS or AS and F⁻-F-POSS comprising an omniphobic coating is assisted by aqueous base or acid to be bound on the substrate.

In some embodiments, the substrate is obtained by carrying out an activation step activated by means of a plasma of a gas mixture containing $H_2O$ and at least one gas chosen from Ar, He or $N_2$. In some embodiments, an omniphobic layer having a thickness of between about 10 and about 500 nm is obtained. In some embodiments, the thickness is between about 20 and about 100 nm. In some embodiments, the RMS roughness of the omniphobic layer is less than about 10 nm. In some embodiments, the RMS roughness of the omniphobic layer is between 5 and 10 nm.

Processes

A layer on a substrate can be prepared by applying a solution containing FAS and F⁻-F-POSS in an aqueous or nonaqueous acidic or basic solvent to the surface of a substrate.

According to a first aspect, the disclosure provides a process for obtaining an omniphobic coating on a substrate comprising the steps of
(a) activating a substrate by contacting the substrate with a plasma of a gas; and
(b) depositing an oleophobic coating comprising at least one fluorocompound as described herein.

In some embodiments, the substrate is a glass material, a ceramic or a glass-ceramic. In some embodiments, the gas is an inert gas, such as Ar or He, a gas, such as $N_2$, $O_2$, or $H_2O$ vapor, or a mixture of such gases. In some embodiments, the at least one fluorocompound is one or more of a fluoroalkyl-silane (FAS), an alkylsilane (AS), or a fluoride ion inserted fluoro polyhedral oligomeric silsesquioxane (F⁻-F-POSS). In some embodiments, the at least one fluorocompound is deposited in a mixture with a protic or an aprotic solvent. In some embodiments, the at least one fluorocompound is deposited in a mixture with a protic or an aprotic solvent containing an aqueous base or an aqueous acid.

In some embodiments, the step of activating can be carried out by means of a plasma of a gas mixture containing $H_2O$. In some embodiments, the step of depositing is carried out by dip, spray, or thermal chemical vapor deposition (CVD) under conditions enabling an RMS surface roughness of between 5 and 100 nm to be obtained. In some embodiments, the step of depositing provides an RMS surface roughness of between 5 and 10 nm.

In some embodiments, the step of depositing the omniphobic coating is carried out using a solution obtained from a mixture of an either fluoroalkylsilane (FAS) as described herein, alkylsilane (AS) as described herein, fluoride ion inserted fluoro polyhedral oligomeric silsesquioxane as described herein, and aqueous acid or base.

In some embodiments, aqueous acid or base is required to assist nucleophilic reaction of FAS or AS. In one aspect, the acid can be ascorbic acid, citric acid, salicylic acid, acetic acid, hydrochloric acid, oxalic acid, phosphoric acid, and sulfuric acid. In another aspect, the base can be ammonium hydroxide, sodium bicarbonate, sodium carbonate, sodium hydroxide, potassium hydroxide.

Activating Plasma Conditions: The substrate can be treated by an activated gas in the form of a plasma. This step may be carried out in various vacuum or atmospheric-pressure chambers. For example, it is possible to use a parallel-plate RF reactor. The treatment results in a chemical modification of the substrate, but no physical alteration such as morphology. The gas used is chosen from Ar, He, $N_2$, or $O_2$ or a mixture of these gases. The working pressure is regulated between 50 and 500 mtorr, the power between 10 and 200 W, and the activation time is preferably between about 1 minute and about 5 minutes, typically within 1 minute.

Omniphobic Layer Deposition Conditions: In some embodiments, the omniphobic layer comprising an either FAS or AS, $F^-$-F-POSS, and aqueous base may be deposited by any technique known at the present time, without the choice of deposition technique being considered as preferred technique in the context of the present invention. In particular, the omniphobic layer may be deposited, without being restricted thereto, by dip, spray, and wipe-on techniques well known in the field.

Embodiments of the invention are further described by the following enumerated clauses. It will be understood that any of the embodiments described herein can be used in connection with any other embodiments described herein to the extent that the embodiments do not contradict one another:

Clause 1. A process for obtaining an omniphobic coating on a substrate comprising the steps of
  a. activating a substrate by contacting the substrate with a plasma of a gas; and
  b. depositing an oleophobic coating comprising at least one fluorocompound.

Clause 2. The process of clause 1, a fluoride ion inserted fluoro polyhedral oligomeric silsesquioxane ($F^-$-F-POSS) of the formula

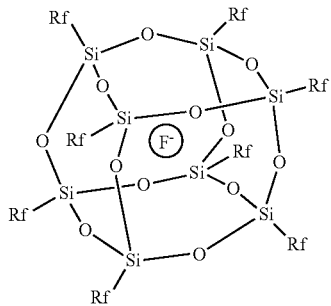

wherein Rf is $F_3C-(CF_2)_m-(CH_2)_n-$, wherein m is an integer from 0 to 15 and n is an integer from 0 to 5; or an FAS agents of the formula

$$F_3C-(CF_2)_m-(CH_2)_n-Si(X)_{3-p}(R)_p$$

wherein m is an integer from 0 to 15; n is an integer from 0 to 5; p is 0, 1 or 2; R is an alkyl group or a hydrogen atom; and X is a hydrolysable group; or AS agents of the formula

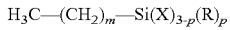

$$H_3C-(CH_2)_m-Si(X)_{3-p}(R)_p$$

wherein m is an integer from 0 to 15; p is 0, 1 or 2; R is an alkyl group or a hydrogen atom; and X is a hydrolysable group.

Clause 3. The process of clause 2, wherein the step of depositing is carried out with a mixture of at least one fluorocompound and aqueous base or acid.

Clause 4. The process of clause 1, wherein the substrate is a glass material, a ceramic or a glass-ceramic.

Clause 5. The process of clause 1, wherein the gas is a mixture containing $H_2O$ vapor, and at least one gas selected from the group consisting of from Ar, He and N2.

Clause 6. The process of clause 1, wherein the at least one fluorocompound is deposited in a mixture with a protic or an aprotic solvent.

Clause 7. The process of clause 6, wherein the protic solvent is ethanol.

Clause 8. The process of clause 1, wherein depositing is carried out by dip, spray, or thermal chemical vapor deposition (CVD).

Clause 9. The process of clause 1, wherein depositing is carried out by dip, spray, or thermal chemical vapor deposition (CVD) under conditions enabling an RMS surface roughness of between 5 and 100 nm to be obtained.

Clause 10. The process of clause 9, wherein RMS surface roughness is between 5 and 10 nm.

Clause 11. The process of clause 3, wherein the acid is selected from the group consisting of ascorbic acid, citric acid, salicylic acid, acetic acid, hydrochloric acid, oxalic acid, phosphoric acid, and sulfuric acid.

Clause 12. The process of clause 3, wherein the aqueous base can be ammonium hydroxide, sodium bicarbonate, sodium carbonate, sodium hydroxide, potassium hydroxide.

Clause 13. An omniphobic glazed substrate comprising a substrate; and an omniphobic coating comprising an omniphobic layer of FAS or AS and F--F-POSS.

Clause 14. The omniphobic glazed substrate of clause 13, wherein the substrate is a glass material, a ceramic or a glass-ceramic.

Clause 15. The omniphobic glazed substrate of clause 14, wherein omniphobic coating further comprises aqueous base or acid.

Clause 16. The omniphobic glazed substrate of clause 13, wherein a surface of the substrate has an RMS surface roughness of greater than 5 nm, and has been activated by treatment with a plasma of a gas selected from the group consisting of Ar, He, N2 and O2, or by a plasma of a mixture of at least two of these gases.

Clause 17. The omniphobic glazed substrate of clause 13, wherein a surface of the substrate has an RMS surface roughness of greater than 5 nm, and has been activated by treatment with a plasma of a gas mixture of $H_2O$ vapor and a gas selected from the group consisting of Ar, He and N2.

Clause 18. The omniphobic glazed substrate of clause 13, wherein the omniphobic layer has a thickness of between about 10 and about 500 nm.

Clause 19. The omniphobic glazed substrate of clause 13, wherein the omniphobic layer has a thickness of between about 20 and about 100 nm.

Clause 20. The omniphobic glazed substrate of clause 13, wherein the omniphobic layer has a thickness of about 10 nm.

EXAMPLES

Example 1—Preparation of a Glass Substrate with Plasma Activation

The substrate provided with its primer layer was placed in a chamber of a low-pressure PECVD (plasma-enhanced chemical vapor deposition) reactor. A residual vacuum in the chamber of at least 5 mPa ($5.10^{-5}$ mbar) was firstly created prior to the activating gas being introduced. The gas or gas mixture was introduced for the surface treatment of glass substrate into the chamber with flow rates at 100 sccm until the total pressure in the reactor was set at 350 mTorr. At equilibrium, a plasma of the gas introduced was ignited by electrically biasing the gas diffuser with an average radiofrequency (13.56 MHz) power of 100 W for a time ranging from 1 minute at room temperature.

Example 2—Omniphobic Coating Solution Application

An omniphobic coating solution was prepared by the following manner (the percentage are by weight): a mixture of 90% ethanol and 10% aqueous 5M $NH_4OH$ was obtained. A 5% proportion, relative to the aforementioned two constituents, of the compounds with the formula $C_8F_{17}(CH_2)_2Si(OEt)_3$, where Et is ethyl, and F-F-POSS was added. The mixture was ultrasonicated for 30 minute. The omniphobic coating solution was deposited on the plasma activated substrate by dipping. The specimen was dried in the oven at 75° C. for at least 2 hours.

Example 3—Initial Contact Angle Measurement

The initial contact angle measurement was carried out with water and hexadecane, which provide a reference indication of the omniphobicity of the grafted substrate. The results obtained for the specimens prepared in accordance with specimens are given in Table 1.

TABLE 1

|  | 1 | 2 | 3 | 4 | 5 | Mean |
| --- | --- | --- | --- | --- | --- | --- |
| Water | 106 | 109 | 110 | 110 | 114 | 110 |
| hexadecane | 70 | 71 | 71 | 73 | 74 | 72 |

Example 4—Transmittance Test

Transmittance of the coating was measured in accordance with ASTM D1003. Compared to control (untreated) specimen, the omniphobic coated specimen showed no significant transmittance loss in FIG. 1. It implies that the omniphobic coating is transparent and optically clear.

Example 5—Hot Water Immersion Test

Figure 2:
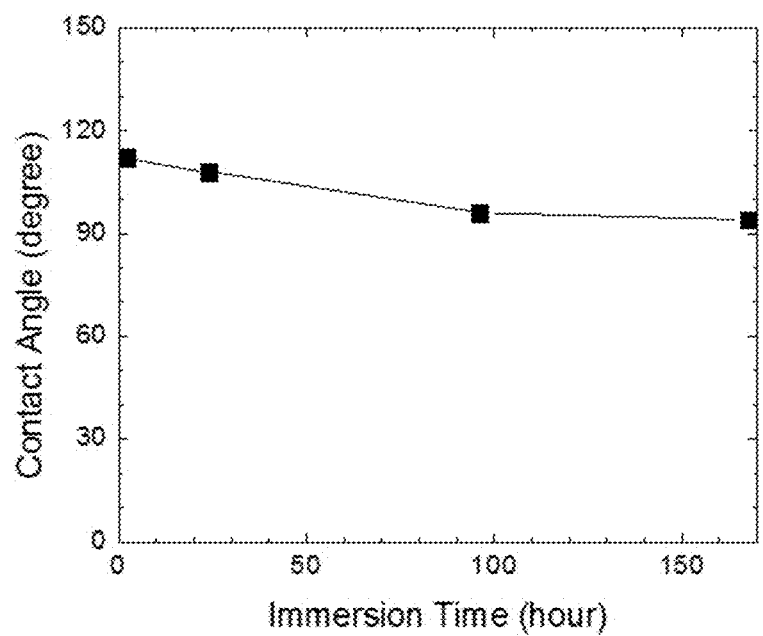
FIG. 2 is a graph of hydrolytic resistance of a glass substrate coated with an omniphobic coating as described herein showing a water contact angle of greater than 90° after 168 hours of immersion.

The aim of an additional step was to measure the hydrolytical resistance properties of the substrates provided with the omniphobic coating according to the invention. The hydrolytical resistance properties of the omniphobic substrates according to the invention were measured conventionally by ASTM D870 standard. The test consists in dipping the sample in neutral water at a temperature of 50° C. The most stringent standard currently in force as regards application on automobile side windows requires a water contact angle of greater than 90° after 168 hours (a week) of the test. The test result shows that water contact angle of the omniphobic coating meets the requirement (>90° after 168 hours) in FIG. 2.

Example 6—Chemical Resistance Test

Figure 3:
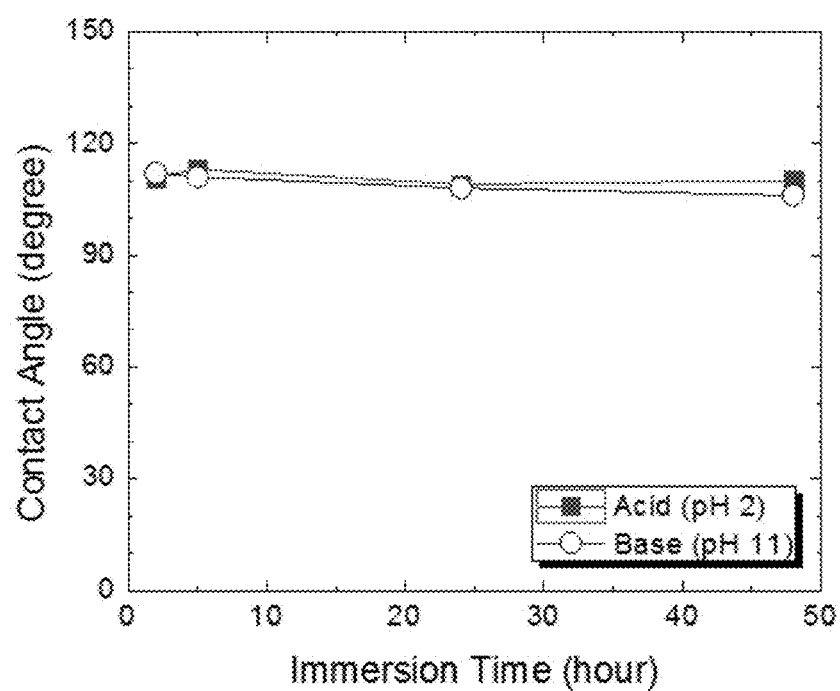
FIG. 3 is a graph of chemical resistance of a glass substrate coated with an omniphobic coating as described herein showing that the coating is chemically stable under acidic (■) and basic (○) environments with a contact angle of greater than 90° after 48 hours of immersion.

In general, a silane-based hydrophobic coating is vulnerable to hydrolysis and coating failure in strong acid and base conditions. The aim of an additional step was to measure the chemical resistance properties of the substrates provided with the omniphobic coating according to the invention. The test consists in dipping the sample in aqueous acid and base solutions at room temperature of 25° C. The most stringent standard currently requires a water contact angle of greater than 90° after 24 hours of the test. The test result shows that water contact angle of the omniphobic coating in acid and base solutions are 111 and 110 degrees, respectively. The omniphobic coating meets the requirement (>90° after 8 hours). Even at extended test period 48 hours, the water contact angle of the omniphobic coating in acid and base solutions are 109 and 106 degree, respectively. It implies that the omniphobic coating is chemically stable even at extremely acidic and basic environments. Results are shown in FIG. 3.

Example 7A—Mechanical Abrasion Test

Figure 4A:
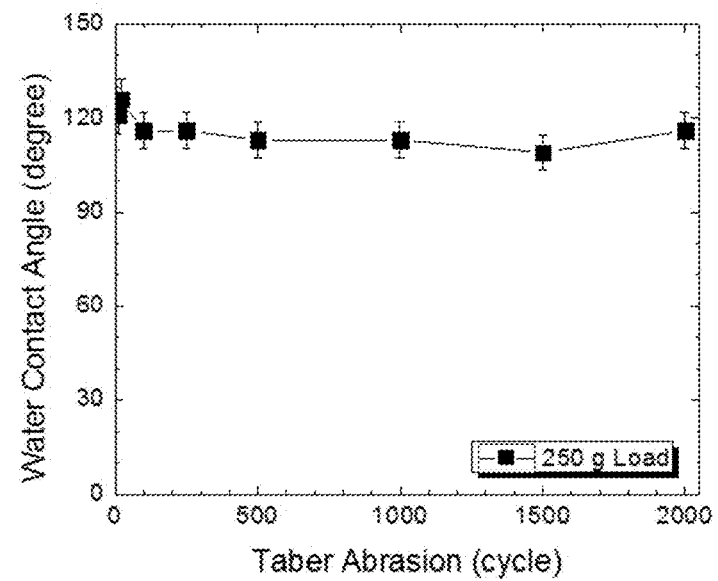
FIGS. 4A-B are graphs of abrasion resistance tests conducted on a glass substrate coated with an omniphobic coating as described herein.

The abrasion resistance of the omniphobic substrates obtained was measured by the ASTM D4060. The test was carried out on the specimens with an abrasive disk of CS 10 hardness under a load of 250 g on an area measuring 1.5 $cm^2$, with a translational rate of 50 cycles/minute and a rotation speed of 6 rpm. A specimen is deemed to be satisfactory in the test if the contact angle remains greater than 80° after 1500 cycles. It may be seen that the abrasion resistance properties of the specimen is sufficient and no marginal degradation of water contact angle as seen in FIG. 4A.

Figure 4B:
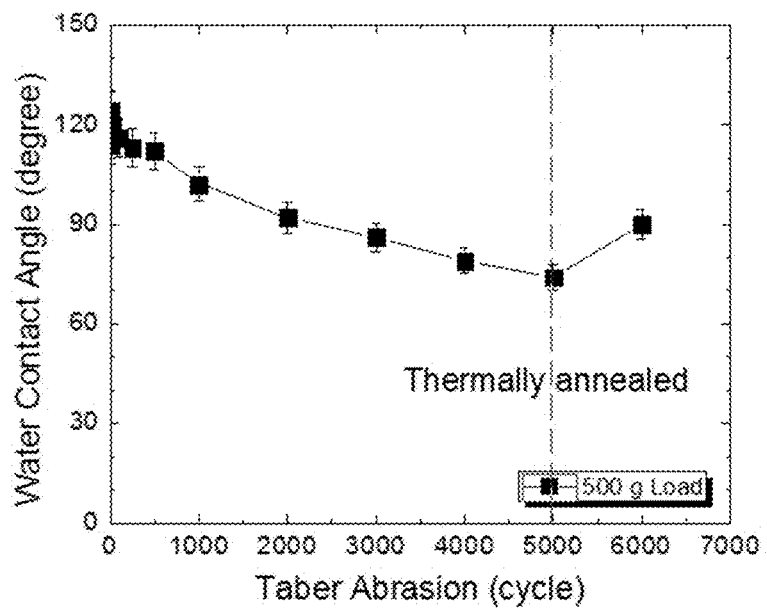

Example 7B—Self-Healing Mechanical Abrasion Test 500 g weight was loaded to the abrasive disk of CS 10 hardness. It may be seen that the abrasion resistance of the specimen shows marginal degradation. Over 5,000 cycles, water contact angle becomes lower than cut off limit (80°). When the specimen was thermally annealed at 75° C. for two hours, the water contact angle of the specimen (74°→90°) was recovered as higher than cut off limit as shown in FIG. 4B.

Example 8—Mechanical Abrasion Test Comparison of Substrates

Figure 5:
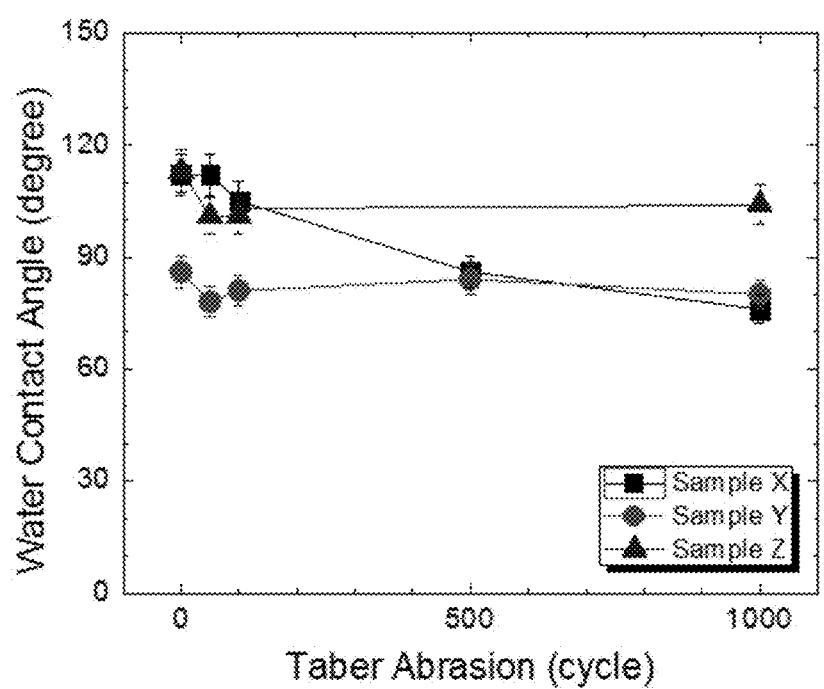

In this test, various test sets such as $F^-$-F-POSS/FAS without aqueous base (sample X), FAS (sample Y), and $F^-$-F-POSS/AS with aqueous base (sample Z) were compared. See FIG. 5. Without addition of aqueous base, the omniphobic coating showed significant performance deterioration after 100 cycles. Liquid repellency of FAS coating (sample Y) was 20% less than the omniphobic coating ($F^-$-F-POSS/FAS with aqueous base). The omniphobic coating ($F^-$-F-POSS/FAS with aqueous base, sample Z) showed similar performance as shown in FIGS. 4A-B. based on the results of this test, the formulation of either $F^-$-F-POSS/FAS with aqueous base or $F^-$-F-POSS/AS with aqueous base would be preferable.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect.

As used in the specification and the appended claims, the singular forms "a," "an" and "the" include plural referents unless the context clearly dictates otherwise.

Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. The word "exemplary" or "illustrative" means "an example of" and is not intended to convey an indication of a preferred or ideal embodiment. "Such as" is not used in a restrictive sense, but for explanatory purposes.

Disclosed are components that can be used to perform the disclosed methods, equipment and systems. These and other components are disclosed herein, and it is understood that when combinations, subsets, interactions, groups, etc., of these components are disclosed that while specific reference of each various individual and collective combinations and permutation of these may not be explicitly disclosed, each is specifically contemplated and described herein, for all methods, equipment and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

It should further be noted that any patents, applications and publications referred to herein are incorporated by reference in their entirety.

What is claimed is:

1. An omniphobic glazed substrate comprising a substrate; and an omniphobic coating comprising an omniphobic layer of a fluoroalkylsilane (FAS) or an alkylsilane (AS) and a fluoride ion encapsulated fluoro polyhedral oligomeric silsesquioxane (F$^-$-F-FOSS), and
   wherein the substrate is a glass material, a ceramic or a glass-ceramic.

2. The omniphobic glazed substrate of claim 1, wherein the omniphobic coating further comprises an aqueous base or an aqueous acid.

3. The omniphobic glazed substrate of claim 1, wherein a surface of the substrate has an RMS surface roughness of greater than 5 nm, and has been activated by treatment with a plasma of a gas selected from the group consisting of Ar, He, $N_2$ and $O_2$, or by a plasma of a mixture of at least two of these gases.

4. The omniphobic glazed substrate of claim 1, wherein a surface of the substrate has an RMS surface roughness of greater than 5 nm, and has been activated by treatment with a plasma of a gas mixture of $H_2O$ vapor and a gas selected from the group consisting of Ar, He and $N_2$.

5. The omniphobic glazed substrate of claim 1, wherein the omniphobic layer has a thickness of between about 10 and about 500 nm.

6. The omniphobic glazed substrate of claim 1, wherein the omniphobic layer has a thickness of between about 20 and about 100 nm.

7. The omniphobic glazed substrate of claim 1, wherein the omniphobic layer has a thickness of about 10 nm.

8. The omniphobic glazed substrate of claim 1, wherein the fluoride ion encapsulated fluoro polyhedral oligomeric silsesquioxane (F$^-$-F-POSS) has the following formula:

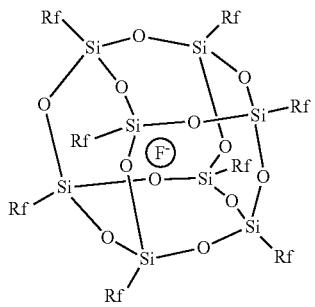

wherein Rf is $F_3C-(CF_2)_m-(CH_2)_n-$, wherein m is an integer from 0 to 15 and n is an integer from 0 to 5; the fluoroalkylsilane (FAS) has the formula $F_3C-(CF_2)_m-(CH_2)_n-Si(X)_{3-p}(R)_p$ wherein m is an integer from 0 to 15; n is an integer from 0 to 5; p is 0, 1 or 2; R is an alkyl group or a hydrogen atom; and X is a hydrolysable group; and the alkylsilane (AS) has the formula $H_3C-(CH_2)_m-Si(X)_{3-p}(R)_p$ wherein m is an integer from 0 to 15; p is 0, 1 or 2; R is an alkyl group or a hydrogen atom; and X is a hydrolysable group.

9. An omniphobic glazed substrate comprising a substrate; and an omniphobic coating comprising an omniphobic layer of a fluoroalkylsilanes (FAS) or an alkylsilane (AS) and a fluoride ion encapsulated fluoro polyhedral oligomeric silsesquioxane (F$^-$-F-FOSS), and
   wherein the omniphobic coating is deposited onto an activated substrate so that the omniphobic layer is bonded to the substrate.

* * * * *